US012803610B2

(12) United States Patent
Yamada et al.

(10) Patent No.: US 12,803,610 B2
(45) Date of Patent: Nov. 17, 2026

(54) RADIO-FREQUENCY MODULE AND COMMUNICATION DEVICE

(71) Applicant: Murata Manufacturing Co., Ltd., Nagaokakyo (JP)

(72) Inventors: Takashi Yamada, Nagaokakyo (JP); Kiyoshi Aikawa, Nagaokakyo (JP); Motoji Tsuda, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 357 days.

(21) Appl. No.: 18/437,360

(22) Filed: Feb. 9, 2024

(65) Prior Publication Data

US 2024/0178871 A1 May 30, 2024

Related U.S. Application Data

(63) Continuation of application No. PCT/JP2022/019653, filed on May 9, 2022.

(30) Foreign Application Priority Data

Aug. 20, 2021 (JP) ................................ 2021-134721

(51) Int. Cl.
*H04B 1/38* (2015.01)
*H03H 7/38* (2006.01)

(52) U.S. Cl.
CPC ................ *H04B 1/38* (2013.01); *H03H 7/38* (2013.01)

(58) Field of Classification Search
CPC .................................. H04B 1/38; H03H 7/38
See application file for complete search history.

(56) References Cited

U.S. PATENT DOCUMENTS 8,253,477 B2 * 8/2012 Douts ...................... G11C 8/08 327/543
10,461,150 B2 * 10/2019 Tanaka ................ H10D 62/106
(Continued)

FOREIGN PATENT DOCUMENTS

JP 2008-177519 A 7/2008
JP 2009-182172 A 8/2009
(Continued)

OTHER PUBLICATIONS

International Search Report and Written Opinion mailed on Jul. 19, 2022, received for PCT Application PCT/ JP2022/019653, filed on May 9, 2022, 9 pages including English Translation.

*Primary Examiner* — Hai V Nguyen
(74) *Attorney, Agent, or Firm* — XSENSUS LLP

(57) ABSTRACT

A radio-frequency module including a module substrate, a plurality of electronic components, a plurality of external connection terminals, a resin member, and a plurality of electrodes. The module substrate has first and second major surfaces that are opposite to each other. The plurality of electronic components are disposed at the major surface and at the major surface. The external connection terminals are disposed at the major surface and include a first external connection terminal. The resin member is disposed at the major surface. The plurality of electrodes are disposed at the major surface and coupled to the plurality of external connection terminals. The plurality of electronic components include a passive component disposed at the major surface. At least a portion of the first external connection terminal overlaps at least a portion of the passive component in plan view of the module substrate.

20 Claims, 5 Drawing Sheets

(56) References Cited

U.S. PATENT DOCUMENTS

| | | | | |
|---|---|---|---|---|
| 11,290,144 | B2 * | 3/2022 | Yoshida | H04B 1/40 |
| 11,528,044 | B2 * | 12/2022 | Matsumoto | H04B 1/006 |
| 12,040,824 | B2 * | 7/2024 | Oshita | H04B 1/0458 |
| 12,096,552 | B2 * | 9/2024 | Takematsu | H03H 7/46 |
| 2009/0295362 | A1 * | 12/2009 | Douts | G11C 5/145<br>323/351 |
| 2017/0012194 | A1 * | 1/2017 | Wang | H10D 30/62 |
| 2018/0337231 | A1 * | 11/2018 | Tanaka | H10D 62/106 |
| 2021/0203372 | A1 * | 7/2021 | Yoshida | H04B 1/40 |
| 2021/0219419 | A1 * | 7/2021 | Takematsu | H03H 9/72 |

FOREIGN PATENT DOCUMENTS

| | | | |
|---|---|---|---|
| JP | 2020-126921 | A | 8/2020 |
| JP | 2021-106341 | A | 7/2021 |
| WO | 2018/168653 | A1 | 9/2018 |
| WO | 2018/173750 | A1 | 9/2018 |
| WO | 2020/090230 | A1 | 5/2020 |

* cited by examiner

RADIO-FREQUENCY MODULE AND COMMUNICATION DEVICE

CROSS-REFERENCE TO RELATED APPLICATIONS

This is a continuation application of PCT/JP2022/019653, filed on May 9, 2022, designating the United States of America, which is based on and claims priority to Japanese Patent Application No. JP 2021-134721 filed on Aug. 20, 2021. The entire contents of the above-identified applications, including the specifications, drawings and claims, are incorporated herein by reference in their entirety.

TECHNICAL FIELD

The present disclosure relates to a radio-frequency module and a communication device.

BACKGROUND ART

In mobile communication devices such as mobile phones, the complexity of radio-frequency front-end modules has increased, particularly due to the development of multiband operation. In Patent Document 1, the size of the radio-frequency module is reduced by mounting components on both sides of a module substrate.

CITATION LIST

Patent Document

Patent Document 1: International Publication No. 2018/168653

SUMMARY OF DISCLOSURE

Technical Problem

However, in the known technology, assuming an increased number of components are disposed on the back surface of the module substrate, the radio-frequency module may sometimes be inadequately fixed to another object (for example, a mother substrate).

The present disclosure provides a radio-frequency module and a communication device that enable a double-sided mounting module to be more firmly fixed to another object (for example, a mother substrate).

Solution to Problem

A radio-frequency module according to an aspect of the present disclosure has a first major surface and a second major surface that are opposite to each other. The radio-frequency module includes a module substrate having a third major surface and a fourth major surface that are opposite each other, the third major surface being disposed alongside the first major surface, the fourth major surface being disposed alongside the second major surface, a plurality of electronic components disposed at the third major surface and at the fourth major surface, a plurality of external connection terminals disposed at the second major surface, the plurality of external connection terminals including a first external connection terminal, a first resin member at least partially covering the fourth major surface and an electronic component disposed at the fourth major surface, and a plurality of electrodes disposed at the fourth major surface, the plurality of electrodes being coupled to the plurality of external connection terminals. The plurality of electronic components include a passive component that is disposed at the fourth major surface and that includes at least one of a capacitor and an inductor. At least a portion of the first external connection terminal overlaps at least a portion of the passive component in plan view of the module substrate.

Advantageous Effects of Disclosure

The radio-frequency module according to an aspect of the present disclosure enables a double-sided mounting module to be more firmly fixed to another object (for example, a mother substrate).

DESCRIPTION OF EMBODIMENTS

Figure 1:
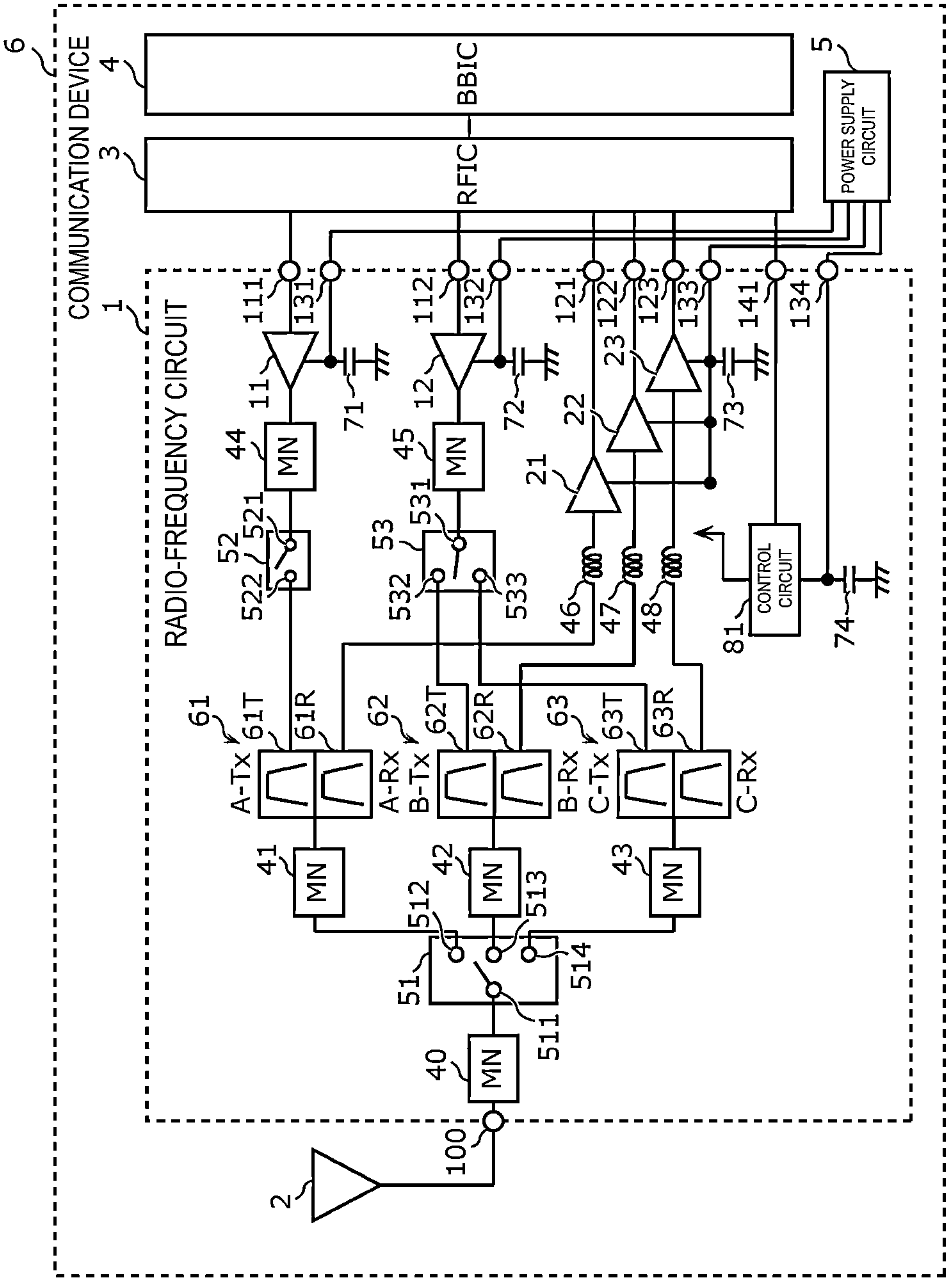
FIG. 1 is a circuit configuration diagram of a radio-frequency circuit and a communication device according to an embodiment.

Hereinafter, an embodiment of the present disclosure will be described in detail with reference to the drawings. The embodiment described below represents a comprehensive or specific example. Details such as numerical values, shapes, materials, constituent elements, and arrangements and connection modes of the constituent elements provided in the following embodiment are illustrative and are not intended to limit the present disclosure.

The drawings are schematically illustrated with necessary emphasis, omissions, or proportion adjustments to depict the present disclosure and do not necessarily represent exact details; thus, the shapes, positional relationships, and proportions can differ from actual implementations. Identical reference numerals are assigned to substantially the same configuration elements across the drawings, and redundant descriptions of these configuration elements can be omitted or simplified.

In the drawings described later, the x-axis and the y-axis are perpendicular to each other in a plane parallel to the major surfaces of a module substrate. Specifically, assuming the module substrate is rectangular in plan view, the x-axis is parallel to a first side of the module substrate, and the y-axis is parallel to a second side perpendicular to the first side of the module substrate. The z-axis is perpendicular to the major surfaces of the module substrate. Along the z-axis, the positive direction indicates upward, and the negative direction indicates downward.

In the circuit configurations of the present disclosure, the term "coupled" applies assuming one circuit element is directly coupled to another circuit element via a connection terminal and/or an interconnect conductor. The term also applies assuming one circuit element is electrically coupled to another circuit element via still another circuit element. The term "coupled between A and B" refers to a situation in which one circuit element is positioned between A and B and coupled to both A and B. The term applies assuming the circuit element is coupled in series in the path connecting A and B and also assuming the circuit element is coupled in parallel (shunt-connected) between the path and ground.

In the component layouts of the present disclosure, the term "plan view of a module substrate" refers to a situation in which an object is orthogonally projected onto an xy-plane and viewed from the positive side of the z-axis. The term "sectional view of a module substrate" refers to a situation in which an object is cut along a plane that is perpendicular to an xy plane, and viewed from this perspective. The expression "A is disposed between B and C" refers to a situation in which at least one of the line segments each connecting any given point within B to any given point within C passes through A. The expression "A is in physical contact with B" refers to a situation in which the boundary of A is in contact with the boundary of B at least at one of the sections where both A and B are cut. Terms describing relationships between elements, such as "parallel" and "vertical", terms indicating an element's shape, such as "rectangular", and numerical ranges are not meant to convey only precise meanings. These terms and numerical ranges denote meanings that are substantially the same, involving, for example, about several percent differences.

In the component layouts of the present disclosure, the expression "a component is disposed at a major surface of a substrate" applies assuming the component is disposed in contact with the major surface of the substrate and also assuming the component is disposed above the major surface without making contact with the major surface (for example, assuming the component is stacked on another component that is disposed in contact with the major surface). The expression "a component is disposed at a major surface of a substrate" may apply assuming the component is disposed in a depressed portion formed at the major surface. The expression "a component is disposed inside a substrate" applies assuming the component is encapsulated in the module substrate; additionally, the expression applies assuming the component is entirely positioned between the two major surfaces of the substrate yet not fully covered by the substrate and also applies assuming merely a portion of the component is disposed inside the substrate.

In the present disclosure, the term "electronic component" includes active and passive components and does not include electromechanical components (for example, terminals, connectors, and wires). The term "active component" refers to a component that includes an active element. The term "passive component" refers to a component that includes a passive element and does not include any active element. The term "active element" refers to an element that performs an active operation (for example, amplification or rectification) with supplied power. Examples of the active element include transistors and diodes. The term "passive element" refers to an element that consumes, stores, or releases supplied power and does not perform any active operation. Examples of the passive element include inductors, capacitors, transformers, and resistors.

(Embodiment)

[1 Circuit Configuration of Radio-Frequency Circuit 1 and Communication Device 6]

A circuit configuration of a radio-frequency circuit 1 and a communication device 6 according to the present embodiment will be described with reference to FIG. 1. FIG. 1 is a circuit configuration diagram of the radio-frequency circuit 1 and the communication device 6 according to the present embodiment.

[1.1 Circuit Configuration of Communication Device 6]

First, a circuit configuration of the communication device 6 will be described. As illustrated in FIG. 1, the communication device 6 according to the present embodiment includes the radio-frequency circuit 1, an antenna 2, a radio-frequency integrated circuit (RFIC) 3, and a baseband integrated circuit (BBIC) 4, and a power supply circuit 5.

The radio-frequency circuit 1 is operable to transfer radio-frequency signals between the antenna 2 and the RFIC 3. An internal configuration of the radio-frequency circuit 1 will be described later.

The antenna 2 is coupled to an antenna connection terminal 100 of the radio-frequency circuit 1. The antenna 2 is operable to transmit a radio-frequency signal outputted from the radio-frequency circuit 1 and to receive a radio-frequency signal from outside and output the radio-frequency signal to the radio-frequency circuit 1.

The RFIC 3 is an example of a signal processing circuit for processing radio-frequency signals. Specifically, the RFIC 3 is operable to process, for example by down-conversion, radio-frequency receive signals inputted through receive paths of the radio-frequency circuit 1 and output the receive signals generated by the signal processing to the BBIC 4. The RFIC 3 is also operable to process, for example by up-conversion, transmit signals inputted from the BBIC 4 and output the radio-frequency transmit signals generated by the signal processing to transmit paths of the radio-frequency circuit 1. The RFIC 3 includes a control unit for controlling elements included in the radio-frequency circuit 1, such as switches and amplifiers. The function of the control unit of the RFIC 3 may be partially or entirely implemented outside the RFIC 3; for example, the function of the control unit of the RFIC 3 may be implemented in the BBIC 4 or the radio-frequency circuit 1.

The BBIC 4 is a baseband signal processing circuit for performing signal processing using an intermediate frequency band that is lower than radio-frequency signals transferred by the radio-frequency circuit 1. Signals such as image signals for image display and/or sound signals for calls through speakers are used as signals to be processed by the BBIC 4.

The power supply circuit 5 is coupled to a power supply (not illustrated in the drawing) and the radio-frequency circuit 1. The power supply circuit 5 is operable to supply power to the radio-frequency circuit 1. The power supply circuit 5 may be included in the radio-frequency circuit 1.

The antenna 2, the BBIC 4, and the power supply circuit 5 are non-essential constituent elements in the communication device 6 according to the present embodiment.

[1.2 Circuit Configuration of Radio-Frequency Circuit 1]

Next, a circuit configuration of the radio-frequency circuit 1 will be described. As illustrated in FIG. 1, the radio-frequency circuit 1 includes power amplifiers (PA) 11 and 12, low-noise amplifiers (LNA) 21 to 23, matching circuits (MN) 40 to 45, inductors (L) 46 to 48, switches (SW) 51 to 53, duplexers 61 to 63, capacitors (C) 71 to 74, a control circuit 81 (PAC), the antenna connection terminal 100, radio-frequency input terminals 111 and 112, radio-frequency output terminals 121 to 123, the power supply terminals 131 to 134, and a control terminal 141. In the following, the constituent elements of the radio-frequency circuit 1 will be individually described.

The antenna connection terminal 100 is coupled to the antenna 2 outside the radio-frequency circuit 1.

The radio-frequency input terminals 111 and 112 are terminals for receiving radio-frequency transmit signals from outside the radio-frequency circuit 1. In the present embodiment, the radio-frequency input terminals 111 and 112 are coupled to the RFIC 3 outside the radio-frequency circuit 1.

The radio-frequency output terminals 121 to 123 are terminals for supplying radio-frequency receive signals to outside the radio-frequency circuit 1. In the present embodiment, the radio-frequency output terminals 121 to 123 are coupled to the RFIC 3 outside the radio-frequency circuit 1.

Each of the power supply terminals 131 to 134 is a terminal for receiving power supplied from outside. In the present embodiment, the power supply terminals 131 to 134 are coupled to the power supply circuit 5 outside the radio-frequency circuit 1. The power supply terminals 131 to 134 are also coupled to the power amplifiers 11 and 12, the low-noise amplifiers 21 to 23, and the control circuit 81 inside the radio-frequency circuit 1.

The control terminal 141 is a terminal for transferring control signals. Specifically, the control terminal 141 functions as a terminal for receiving control signals from outside the radio-frequency circuit 1 and/or a terminal for supplying control signals to outside the radio-frequency circuit 1. The control signal relates to controls on electronic circuits included in the radio-frequency circuit 1. Specifically, the control signal is a digital signal for controlling, for example, at least one of the power amplifiers 11 and 12, the low-noise amplifiers 21 to 23, and the switches 51 to 53.

Each of the power amplifiers 11 and 12 includes an amplifier transistor, which is an active element. The power amplifiers 11 and 12 are able to obtain output signals with higher energy than input signals (transmit signals), using power supplied from the power supply. Each of the power amplifiers 11 and 12 may additionally include a passive element (for example, an inductor and/or a capacitor). The internal configuration of the power amplifiers 11 and 12 is not limited to a specific configuration. The power amplifiers 11 and 12 may be, for example, multistage amplifiers, differential amplifiers, or Doherty amplifiers.

The power amplifier 11 is coupled between the radio-frequency input terminal 111 and a transmit filter 61T. The power amplifier 11 is operable to amplify transmit signals in a band A using a supply voltage that is supplied through the power supply terminal 131. Specifically, an input end of the power amplifier 11 is coupled to the radio-frequency input terminal 111. An output end of the power amplifier 11 is coupleable to the transmit filter 61T via the matching circuit 44 and the switch 52.

The power amplifier 12 is coupled between the radio-frequency input terminal 112 and transmit filters 62T and 63T. The power amplifier 12 is operable to amplify transmit signals in bands B and C using a supply voltage that is supplied through the power supply terminal 132.

Specifically, an input end of the power amplifier 12 is coupled to the radio-frequency input terminal 112. An output end of the power amplifier 12 is coupleable to the transmit filters 62T and 63T via the matching circuit 45 and the switch 53.

Each of the low-noise amplifiers 21 to 23 includes an amplifier transistor, which is an active element. The low-noise amplifiers 21 to 23 are able to obtain output signals with higher energy than input signals (receive signals), using power supplied from the power supply. Each of the low-noise amplifiers 21 to 23 may additionally include a passive element (for example, an inductor and/or a capacitor). The internal configuration of the low-noise amplifiers 21 to 23 is not limited to a specific configuration.

The low-noise amplifier 21 is coupled between a receive filter 61R and the radio-frequency output terminal 121. The low-noise amplifier 21 is operable to amplify receive signals in the band A using a supply voltage that is supplied through the power supply terminal 133.

Specifically, an input end of the low-noise amplifier 21 is coupled to the receive filter 61R via the inductor 46. An output end of the low-noise amplifier 21 is coupled to the radio-frequency output terminal 121.

The low-noise amplifier 22 is coupled between a receive filter 62R and the radio-frequency output terminal 122. The low-noise amplifier 22 is operable to amplify receive signals in the band B using a supply voltage that is supplied through the power supply terminal 133.

Specifically, an input end of the low-noise amplifier 22 is coupled to the receive filter 62R via the inductor 47. An output end of the low-noise amplifier 22 is coupled to the radio-frequency output terminal 122.

The low-noise amplifier 23 is coupled between a receive filter 63R and the radio-frequency output terminal 123. The low-noise amplifier 23 is operable to amplify receive signals in the band C using a supply voltage that is supplied through the power supply terminal 133.

Specifically, an input end of the low-noise amplifier 23 is coupled to the receive filter 63R via the inductor 48. An output end of the low-noise amplifier 23 is coupled to the radio-frequency output terminal 123.

Each of the matching circuits 40 to 45 is coupled between two circuit elements and operable to provide impedance matching between the two circuit elements. This means that the matching circuits 40 to 45 are impedance matching circuits. Each of the matching circuits 40 to 45 includes a passive element. Specifically, each of the matching circuits 40 to 45 may include an inductor and/or a capacitor. Each of the matching circuits 40 to 45 may include a transformer.

The inductor 46 is coupled between the receive filter 61R and the low-noise amplifier 21. The inductor 46 is operable to provide impedance matching between the receive filter 61R and the low-noise amplifier 21. The inductor 47 is coupled between the receive filter 62R and the low-noise amplifier 22. The inductor 47 is operable to provide impedance matching between the receive filter 62R and the low-noise amplifier 22. The inductor 48 is coupled between the receive filter 63R and the low-noise amplifier 23. The inductor 48 is operable to provide impedance matching between the receive filter 63R and the low-noise amplifier 23.

The switch 51 is coupled between the antenna connection terminal 100 and the duplexers 61 to 63. The switch 51 has terminals 511 to 514. The terminal 511 is coupled to the antenna connection terminal 100 via the matching circuit 40. The terminal 512 is coupled to the duplexer 61 via the matching circuit 41. The terminal 513 is coupled to the duplexer 62 via the matching circuit 42. The terminal 514 is coupled to the duplexer 63 via the matching circuit 43.

With this connection configuration, the switch 51 is operable to connect the terminal 511 to at least one of the terminals 512 to 514 in response to, for example, a control signal from the RFIC 3. In other words, the switch 51 is operable to control connection and disconnection between the antenna connection terminal 100 and each of the duplexers 61 to 63. The switch 51 is implemented by, for example, a multi-connection switching circuit.

The switch 52 is coupled between the power amplifier 11 and the transmit filter 61T. The switch 52 has terminals 521 and 522. The terminal 521 is coupled to the output end of the power amplifier 11 via the matching circuit 44. The terminal 522 is coupled to the transmit filter 61T.

With this connection configuration, the switch 52 is operable to control connection and disconnection between the terminals 521 and 522 in response to, for example, a control signal from the RFIC 3. In other words, the switch 52 is operable to control connection and disconnection between the power amplifier 11 and the transmit filter 61T. The switch 52 is implemented by, for example, a single-pole single-throw (SPST) switching circuit.

The switch 53 is coupled between the power amplifier 12 and the transmit filters 62T and 63T. The switch 53 has terminals 531 to 533. The terminal 531 is coupled to the output end of the power amplifier 12 via the matching circuit 45. The terminal 532 is coupled to the transmit filter 62T. The terminal 533 is coupled to the transmit filter 63T.

With this connection configuration, the switch 53 is operable to connect the terminal 531 to the terminal 532 or 533 in response to, for example, a control signal from the RFIC 3. In other words, the switch 53 is operable to switch the connection of the power amplifier 12 between the transmit filters 62T and 63T. The switch 53 is implemented by, for example, a single-pole double-throw (SPDT) switching circuit.

The duplexer 61 is operable to pass transmit signals and receive signals in the band A for frequency division duplex (FDD) and to attenuate signals in other bands. The duplexer 61 includes the transmit filter 61T and the receive filter 61R.

The transmit filter 61T has a pass band that includes an uplink operating band of the band A. The transmit filter 61T is operable to pass transmit signals in the band A. One end of the transmit filter 61T is coupleable to the antenna connection terminal 100 via the matching circuit 41, the switch 51, and the matching circuit 40. The other end of the transmit filter 61T is coupleable to the output end of the power amplifier 11 via the switch 52.

The receive filter 61R has a pass band that includes a downlink operating band of the band A. The receive filter 61R is operable to pass receive signals in the band A. One end of the receive filter 61R is coupleable to the antenna connection terminal 100 via the matching circuit 41, the switch 51, and the matching circuit 40. The other end of the receive filter 61R is coupled to the input end of the low-noise amplifier 21 via the inductor 46.

The duplexer 62 is operable to pass transmit signals and receive signals in the band B for FDD and to attenuate signals in other bands. The duplexer 62 includes the transmit filter 62T and the receive filter 62R.

The transmit filter 62T has a pass band that includes an uplink operating band of the band B. The transmit filter 62T is operable to pass transmit signals in the band B. One end of the transmit filter 62T is coupleable to the antenna connection terminal 100 via the matching circuit 42, the switch 51, and the matching circuit 40. The other end of the transmit filter 62T is coupleable to the output end of the power amplifier 12 via the switch 53.

The receive filter 62R has a pass band that includes a downlink operating band of the band B. The receive filter 62R is operable to pass receive signals in the band B. One end of the receive filter 62R is coupleable to the antenna connection terminal 100 via the matching circuit 42, the switch 51, and the matching circuit 40. The other end of the receive filter 62R is coupled to the input end of the low-noise amplifier 22 via the inductor 47.

The duplexer 63 is operable to pass transmit signals and receive signals in the band C for FDD and to attenuate signals in other bands. The duplexer 63 includes the transmit filter 63T and the receive filter 63R.

The transmit filter 63T has a pass band that includes an uplink operating band of the band C. The transmit filter 63T is operable to pass transmit signals in the band C. One end of the transmit filter 63T is coupleable to the antenna connection terminal 100 via the matching circuit 43, the switch 51, and the matching circuit 40. The other end of the transmit filter 63T is coupleable to the output end of the power amplifier 12 via the switch 53.

The receive filter 63R has a pass band that includes a downlink operating band of the band C. The receive filter 63R is operable to pass receive signals in the band C. One end of the receive filter 63R is coupleable to the antenna connection terminal 100 via the matching circuit 43, the switch 51, and the matching circuit 40. The other end of the receive filter 63R is coupled to the input end of the low-noise amplifier 23 via the inductor 48.

The bands A to C are frequency bands for communication systems built using a radio access technology (RAT). The bands A to C are defined by standardization organizations such as the 3rd Generation Partnership Project (3GPP) (registered trademark) and the Institute of Electrical and Electronics Engineers (IEEE). Examples of the communication systems include 5th Generation New Radio (5GNR) systems, Long Term Evolution (LTE) systems, and wireless local area network (WLAN) systems.

The bands A, B, and C may belong to different band groups or the same band group. As used herein, a band group refers to a frequency range that encompasses multiple bands. For example, an ultra high-band group (3300-5000 MHZ), a high-band group (2300-2690 MHZ), a mid-band group (1427-2200 MHz), and a low-band group (698-960 MHZ) can be used as band groups. However, these are not to be interpreted as limiting. For example, a band group that includes unlicensed bands of 5 gigahertz or higher or a band group composed of millimeter-wave bands may be used as a band group.

For example, the band A may belong to the high-band group, and the bands B and C may belong to the mid-band group. Alternatively, for example, the band A may belong to the mid-band group or the high-band group, and the bands B and C may belong to the low-band group.

The capacitors 71 to 74 are referred to as bypass capacitors or decoupling capacitors. The capacitors 71 to 74 are operable to mitigate the impact of noise in power supply paths on the radio-frequency circuit. Each of the capacitors 71 to 74 is coupled between a corresponding power supply path and ground. Specifically, the capacitor 71 is coupled between the path connecting the power supply terminal 131 to the power amplifier 11 and ground. The capacitor 72 is coupled between the path connecting the power supply terminal 132 to the power amplifier 12 and ground. The capacitor 73 is coupled between the path connecting the power supply terminal 133 to the low-noise amplifiers 21 to 23 and ground. The capacitor 74 is coupled between the path connecting the power supply terminal 134 to the control circuit 81 and ground.

The control circuit 81 is a circuit that includes an active element. The control circuit 81 is operable to control, for example, the power amplifiers 11 and 12. The control circuit 81 is operable to receive digital control signals from the RFIC 3 through the control terminal 141 and output control signals to, for example, the power amplifiers 11 and 12.

The radio-frequency circuit 1 depicted in FIG. 1 is illustrative, and this is not to be interpreted as limiting. For example, the bands that the radio-frequency circuit 1 supports are not limited to the three bands A to C. For example, the radio-frequency circuit 1 may support four or more bands. In this case, the radio-frequency circuit 1 may include filters for bands D, E, F, and beyond. For example, the radio-frequency circuit 1 may support two or fewer bands; the radio-frequency circuit 1 may support, for example, the bands B and C. In this case, the radio-frequency circuit 1 does not necessarily include the power amplifier 11, the low-noise amplifier 21, the matching circuits 41 and 44, the inductor 46, the switch 52, the duplexer 61, the radio-frequency input terminal 111, and the radio-frequency output terminal 121. For example, the radio-frequency circuit 1 may be a dedicated transmit circuit. In this case, the radio-frequency circuit 1 does not necessarily include the low-noise amplifiers 21 to 23, the inductors 46 to 48, the receive filters 61R to 63R, the radio-frequency output terminals 121 to 123, and the power supply terminal 133. For example, the radio-frequency circuit 1 may be a dedicated receive circuit. In this case, the radio-frequency circuit 1 does not necessarily include the power amplifiers 11 and 12, the matching circuits 44 and 45, the switches 52 and 53, the transmit filters 61T to 63T, the radio-frequency input terminals 111 and 112, and the power supply terminals 131 and 132.

[2 Practical Examples of Radio-Frequency Circuit 1]

[2.1 First Practical Example]

As a first practical example of the radio-frequency circuit 1 according to the embodiment described above, a radio-frequency module 1A including the radio-frequency circuit 1 will be described with reference to FIGS. 2 to 4.

[2.1.1 Component Layout of Radio-Frequency Module 1A]

Figure 2:
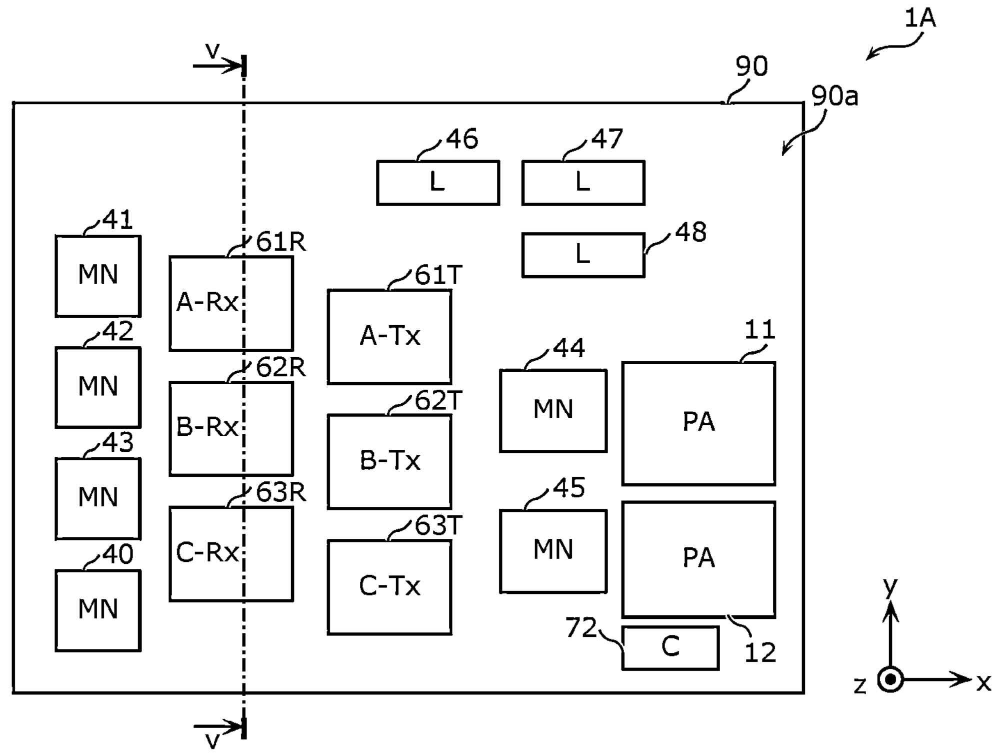
FIG. 2 is a plan view of a radio-frequency module according to a first practical example.

FIG. 2 is a plan view of the radio-frequency module 1A according to the present practical example. FIG. 3 is a plan view of the radio-frequency module 1A according to the present practical example assuming a major surface 90*b* of a module substrate 90 is viewed through the module substrate 90 from the positive side of the z-axis. FIG. 4 is a plan view of the radio-frequency module 1A according to the present practical example assuming a major surface 1*b* of the radio-frequency module 1A is viewed through the radio-frequency module 1A from the positive side of the z-axis. FIG. 5 is a sectional view of the radio-frequency module 1A according to the present practical example. The section plane of the radio-frequency module 1A in FIG. 5 is taken along line v-v in FIGS. 2 to 4.

Figure 3:
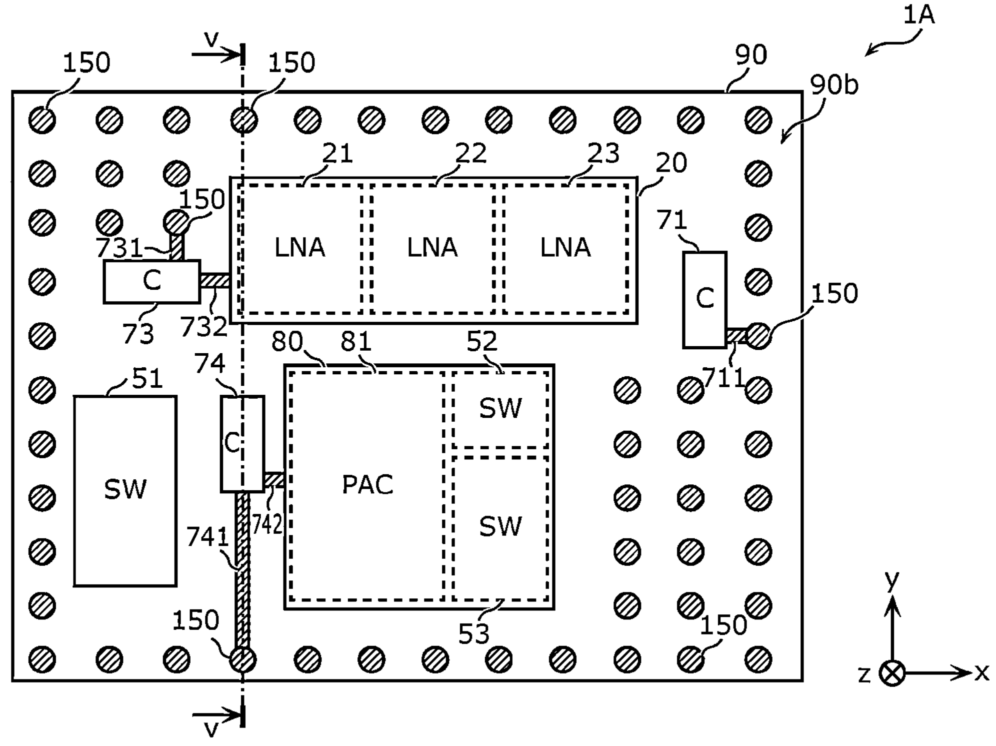
FIG. 3 is a plan view of the radio-frequency module according to the first practical example.
Figure 4:
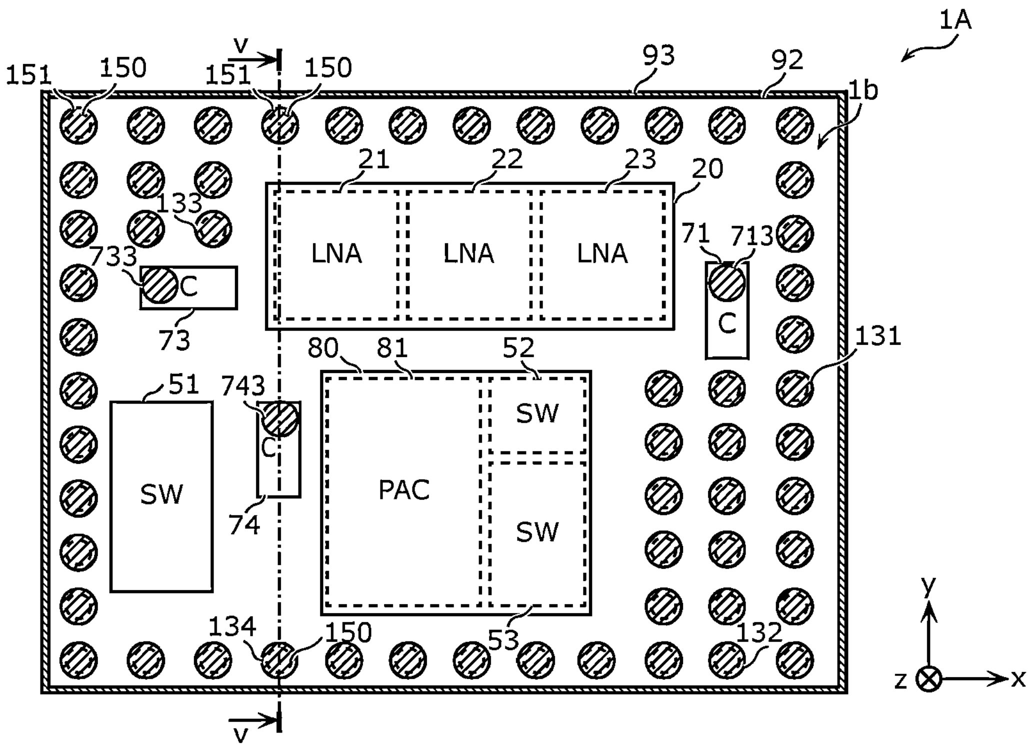
FIG. 4 is a plan view of the radio-frequency module according to the first practical example.
Figure 5:
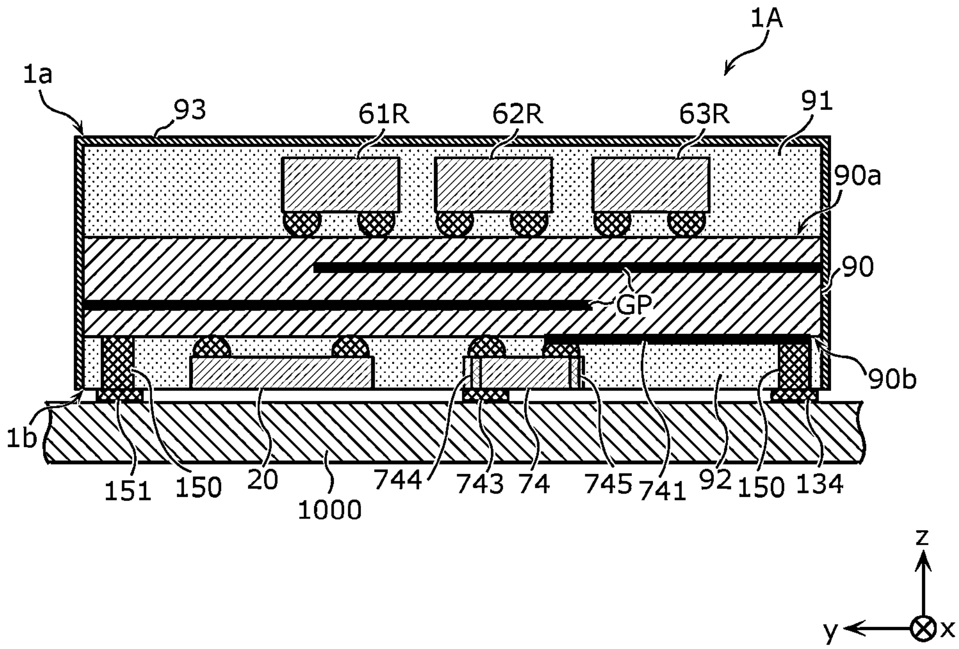
FIG. 5 is a sectional view of the radio-frequency module according to the first practical example.

In FIGS. 2 to 4, to simplify understanding of the positional relationships of the components, each component is labeled with letters representing the circuit that is included in the component. However, these letters are not marked on the actual components. In FIGS. 2 to 5, the wires connecting components disposed at the module substrate 90 are not illustrated, with the exception of some wires. In FIGS. 2 and 3, resin members 91 and 92 covering the components and a shield electrode layer 93 covering the surfaces of the resin members 91 and 92 are not illustrated. Also, in FIG. 5, terminals at a mother substrate 1000 are not illustrated.

The radio-frequency module 1A has major surfaces 1*a* and 1*b* that are opposite to each other. The major surface 1*a* is an example of a first major surface, and the major surface 1*b* is an example of a second major surface. The major surface 1*a* is formed by the surface of the shield electrode layer 93. The major surface 1*b* is formed by the surfaces of the electronic components and the resin member 92 disposed at the major surface 90*b* of the module substrate 90.

In addition to the electronic components including the circuit elements incorporated in the radio-frequency circuit 1 illustrated in FIG. 1, the radio-frequency module 1A includes the module substrate 90, the resin members 91 and 92, the shield electrode layer 93, multiple post electrodes 150, and multiple external connection terminals 151.

The module substrate 90 has major surfaces 90*a* and 90*b* that are opposite to each other. The major surface 90*a* is an example of a third major surface. The major surface 90*a* is disposed alongside the major surface 1*a* of the radio-frequency module 1A. The major surface 90*b* is an example of a fourth major surface. The major surface 90*b* is disposed alongside the major surface 1*b* of the radio-frequency module 1A. More specifically, the major surface 90*a* is parallel to the major surface 1*a*; the major surface 90*a* is close to the major surface 1*a* but distant from the major surface 1*b*. Similarly, the major surface 90*b* is parallel to the major surface 1*b*; the major surface 90*b* is close to the major surface 1*b* but distant from the major surface 1*a*. Ground electrode layers GP are formed inside the module substrate 90. In FIGS. 2 to 4, the module substrate 90 has a rectangular shape in plan view. However, the module substrate 90 is not limited to this shape.

As the module substrate 90, for example, a low temperature co-fired ceramics (LTCC) substrate or high temperature co-fired ceramics (HTCC) substrate that has a layered structure composed of multiple dielectric layers, a component-embedded substrate, a substrate including a redistribution layer (RDL), or a printed-circuit board can be used. However, these are not to be interpreted as limiting.

As illustrated in FIG. 2, at the major surface 90*a*, the power amplifiers 11 and 12, the matching circuits 40 to 45, the inductors 46 to 48, the transmit filters 61T to 63T, the receive filters 61R to 63R, the capacitor 72, and the resin member 91 are disposed.

Two integrated circuits that respectively include the power amplifiers 11 and 12 may be constructed using, for example, complementary metal oxide semiconductor (CMOS). Specifically, the two integrated circuits that respectively include the power amplifiers 11 and 12 may be produced through a silicon on insulator (SOI) process. In this manner, the power amplifiers 11 and 12 can be produced with low costs. The two integrated circuits that respectively include the power amplifiers 11 and 12 may be made of at least one of gallium arsenide (GaAs), silicon germanium (SiGe), and gallium nitride (GaN). With this configuration, the power amplifiers 11 and 12 can be implemented with high quality.

Each of the matching circuits 40 to 43 is implemented by a chip inductor and/or a chip capacitor. A chip inductor is a surface mount device (SMD) that forms an inductor. A chip capacitor is an SMD that forms a capacitor.

Each of the matching circuits 44 and 45 is implemented by a transformer. The coils that constitute the transformers may be partially or entirely disposed inside the module substrate 90.

Each of the inductors 46 to 48 is implemented by a chip inductor. The inductors 46 to 48 overlap the integrated circuit 20 that includes the low-noise amplifiers 21 to 23 in plan view. The inductors 46 to 48 are not limited to chip inductors. For example, the inductors 46 to 48 may be implemented by integrated passive components (IPDs: integrated passive devices).

The capacitor 72 is implemented by a chip capacitor. The capacitor 72 is disposed adjacent to the power amplifier 12.

This configuration shortens the wire between the capacitor 72 as a bypass capacitor and the power amplifier 12. Shortening the wire helps to suppress the degradation of the characteristics of the bypass capacitor that can occur due to wire impedances.

The capacitor 72 is not limited to a chip capacitor. For example, the capacitor 72 may be included in the same electronic component as the power amplifier 12. For example, the capacitor 72 may be implemented by an IPD.

The transmit filters 61T to 63T and the receive filters 61R to 63R may be implemented by, for example, surface acoustic wave (SAW) filters, bulk acoustic wave (BAW) filters, LC resonance filters, or dielectric filters. However, these are not to be interpreted as limiting.

The resin member 91 at least partially covers the major surface 90*a* and the electronic components disposed at the major surface 90*a*. The resin member 91 functions to secure the reliability of mechanical strength, moisture resistance, and other properties of the electronic components disposed at the major surface 90*a*. The resin member 91, however, is not necessarily included in the radio-frequency module 1A.

As illustrated in FIG. 3, at the major surface 90*b*, the integrated circuit 20 that includes the low-noise amplifiers 21 to 23, the integrated circuit 80 that includes the switches 52 and 53 and the control circuit 81, the switch 51, the capacitors 71, 73, and 74, the resin member 92, and the post electrodes 150 are disposed.

Each of the integrated circuit 20, the integrated circuit 80, and the electronic component (hereinafter simply referred to as the switch 51) that includes the switch 51 is an example of an active component. The integrated circuits 20 and 80 and the switch 51 may be constructed using, for example, CMOS. Specifically, the integrated circuits 20 and 80 and the switch 51 may be produced through an SOI process. The integrated circuits 20 and 80 and the switch 51 are not limited to CMOS components.

Each of the three electronic components (hereinafter simply referred to as the capacitors 71, 73, and 74) that respectively include the capacitors 71, 73, and 74 is an example of a passive component and is a semiconductor component. In the present practical example, the capacitors 71, 73, and 74 are silicon capacitors that are constructed using silicon substrates (silicon wafers) through a semiconductor process. The capacitors 71, 73, and 74 are not limited to silicon capacitors and are not necessarily semiconductor components. The capacitors 71, 73, and 74 may be included in IPDs using silicon substrates.

The capacitor 71 is electrically coupled to a post electrode 150 via a wire 711, and the post electrode 150 is electrically coupled to the power supply terminal 131. The capacitor 71 is electrically coupled to the power amplifier 11 through, for example, a via-conductor (not illustrated in the drawing) in the module substrate 90. The capacitor 71 is also electrically coupled to an external connection terminal 713.

At least a portion of the capacitor 71 overlaps at least a portion of the ground electrode layers GP in plan view of the module substrate 90. This configuration improves isolation between the radio-frequency components disposed at the major surface 90*a* and the capacitor 71.

The capacitor 73 is disposed adjacent to the integrated circuit 20. The capacitor 73 is electrically coupled to a post electrode 150 via a wire 731, and the post electrode 150 is electrically coupled to the power supply terminal 133. The capacitor 73 is also electrically coupled to the integrated circuit 20 via a wire 732. The capacitor 73 is also electrically coupled to an external connection terminal 733.

At least a portion of the capacitor 73 overlaps at least a portion of the ground electrode layers GP in plan view of the module substrate 90. This configuration improves isolation between the radio-frequency components disposed at the major surface 90*a* and the capacitor 73.

The capacitor 74 is disposed adjacent to the integrated circuit 80. The capacitor 74 is electrically coupled to a post electrode 150 via a wire 741, and the post electrode 150 is electrically coupled to the power supply terminal 134. The capacitor 74 is also electrically coupled to the integrated circuit 80 via a wire 742. The capacitor 74 is also electrically coupled to an external connection terminal 743.

At least a portion of the capacitor 74 overlaps at least a portion of the ground electrode layers GP in plan view of the module substrate 90. This configuration improves isolation between the radio-frequency components disposed at the major surface 90*a* and the capacitor 74.

The post electrodes 150 are an example of a plurality of electrodes. The post electrodes 150 are coupled to the external connection terminals 151. Specifically, each post electrode 150 protrudes from the major surface 90*b* of the module substrate 90. The end of each post electrode 150 is coupled to a corresponding external connection terminal 151 disposed at the major surface 1*b* of the radio-frequency module 1A. The shape of the post electrodes 150 is not limited to the shape illustrated in FIGS. 3 to 5.

Copper electrodes can be used as the post electrodes 150. The material of the post electrodes 150 is not limited to copper. For example, solder electrodes may be used as the post electrodes.

The resin member 92 is an example of a first resin member. The resin member 92 at least partially covers the major surface 90*b* and the electronic components disposed at the major surface 90*b*. The resin member 92 functions to secure the reliability of mechanical strength, moisture resistance, and other properties of the electronic components disposed at the major surface 90*b*. The resin member 92, however, is not necessarily included in the radio-frequency module 1A.

The major surface 1*b* of the radio-frequency module 1A is formed by grinding the integrated circuits 20 and 80, the switch 51, the capacitors 73 and 74, and the post electrodes 150, which are disposed at the major surface 90*b*, together with the resin member 92. As a result, the integrated circuits 20 and 80, the switch 51, the capacitors 73 and 74, and the post electrodes 150 are exposed at the surface of the resin member 92.

As illustrated in FIG. 4, the external connection terminals 151 are disposed at the major surface 1*b*. The external connection terminals 151 include a ground terminal as well as the antenna connection terminal 100, the radio-frequency input terminals 111 and 112, the radio-frequency output terminals 121 to 123, the power supply terminals 131 to 134, and the control terminal 141, which are illustrated in FIG. 1. The individual external connection terminals 151 are coupled to terminals including, for example, input-output terminals and/or ground terminals at the mother substrate 1000 positioned on the negative side of the z-axis with respect to the radio-frequency module 1A.

The external connection terminals 151 also include the external connection terminals 713, 733, and 743. Each of the external connection terminals 713, 733 and 743 is an example of a first external connection terminal. Each of the external connection terminals 713, 733 and 743 is a ground terminal. The external connection terminals 713, 733 and 743 are not limited to ground terminals. For example, the external connection terminal 713 may be the power supply terminal 131, the external connection terminal 733 may be the power supply terminal 133, and the external connection terminal 743 may be the power supply terminal 134.

At least a portion of the external connection terminal 713 overlaps the capacitor 71 in plan view of the module substrate 90. The external connection terminal 713 is in physical contact with the capacitor 71.

At least a portion of the external connection terminal 733 overlaps the capacitor 73 in plan view of the module substrate 90. The external connection terminal 733 is in physical contact with the capacitor 73.

At least a portion of the external connection terminal 743 overlaps the capacitor 74 in plan view of the module substrate 90. The external connection terminal 743 is in physical contact with the capacitor 74.

The two external connection terminals 151 that function as the power supply terminals 133 and 134 are an example of a second external connection terminal. These two external connection terminals 151 do not overlap the capacitors 73 and 74 in plan view of the module substrate 90.

The shield electrode layer 93 is, for example, a thin metal film that is formed using a sputtering method. The shield electrode layer 93 covers the upper surface of the resin member 91 and the side surfaces of the resin members 91 and 92 and the module substrate 90. The shield electrode layer 93 is grounded to inhibit external noise from interfering with the electronic components constituting the radio-frequency module 1A. The shield electrode layer 93, however, is not necessarily included in the radio-frequency module 1A.

The layout of the electronic components in the present practical example is illustrative, and the present practical example is not to be interpreted as limiting. For example, the power amplifiers 11 and 12 may be disposed at the major surface 90*b*. In this case, the capacitors 71 and 72 may be disposed at the major surface 90*b*. The integrated circuit 20 and the capacitor 73 may be disposed at the major surface 90*a*.

[2.1.2 Internal Structure of Capacitor 74]

Figure 6:
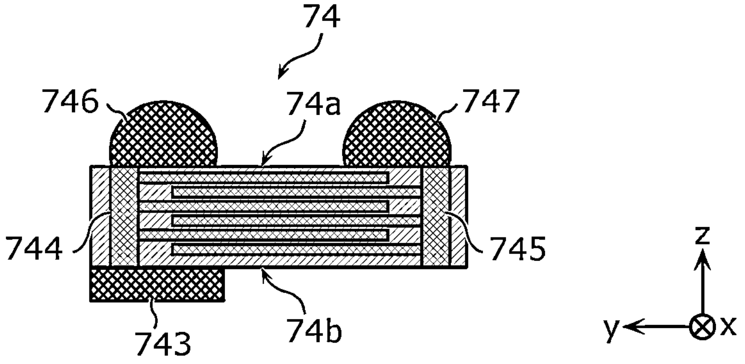
FIG. 6 is a sectional view of a capacitor in the first practical example.

Next, an internal structure of the capacitor 74 will be described with reference to FIG. 6. FIG. 6 is a sectional view of the capacitor 74 in the present practical example. Since the capacitors 71 and 73 are the same as the capacitor 74, the illustration and description of the capacitors 71 and 73 are omitted.

The capacitor 74 has major surfaces 74*a* and 74*b* that are opposite to each other. The major surface 74*a* is an example of a fifth major surface. The major surface 74*a* faces the major surface 90*b* of the module substrate 90. The major surface 74*b* is an example of a sixth major surface. The major surface 74*b* is exposed at the surface of the resin member 92, and the major surface 74*b* forms a portion of the major surface 1*b* of the radio-frequency module 1A.

The capacitor 74 also includes electrodes 744 and 745 and terminals 746 and 747.

The electrode 744 forms one end of the capacitor 74. The electrode 744 is electrically coupled to the external connection terminal 743 and the terminal 746. The electrode 745 forms the other end of the capacitor 74. The electrode 745 is electrically coupled to the terminal 747. The electrodes 744 and 745 are electrically isolated from each other and can store charges.

The terminal 746 is disposed at the major surface 74*a*. The terminal 746 is electrically coupled to the ground electrode layer GP in the module substrate 90. The terminal 746 is not necessarily electrically coupled to the ground electrode layer GP. The terminal 747 is disposed at the major surface 74*a*. The terminal 747 is electrically coupled to the power supply terminal 134 via the wire 741 and the post electrode 150 and also electrically coupled to the control circuit 81 in the integrated circuit 80 via the wire 742.

[2.1.3 Effects of Radio-Frequency Module 1A]

As described above, the radio-frequency module 1A according to the present practical example has the major surfaces 1*a* and 1*b* that are opposite to each other. The radio-frequency module 1A includes the module substrate 90, a plurality of electronic components, the external connection terminals 151, the resin member 92, and a plurality of electrodes. The module substrate 90 has the major surfaces 90*a* and 90*b* that are opposite to each other. The major surface 90*a* is disposed alongside the major surface 1*a*, and the major surface 90*b* is disposed alongside the major surface 1*b*. The plurality of electronic components are disposed at the major surface 90*a* and at the major surface 90*b*. The external connection terminals 151 are disposed at the major surface 1*b* and include a first external connection terminal (for example, the external connection terminal 743). The resin member 92 at least partially covers the major surface 90*b* and the electronic components disposed at the major surface 90*b*. The plurality of electrodes (for example, the post electrodes 150) are disposed at the major surface 90*b* and coupled to the external connection terminals 151. The plurality of electronic components include a passive component (for example, the capacitor 74) that is disposed at the major surface 90*b* and that includes at least one of a capacitor and an inductor. At least a portion of the first external connection terminal overlaps at least a portion of the passive component in plan view of the module substrate 90.

Since the passive component is disposed at the major surface 90*b*, this configuration enhances the flexibility in positioning the passive component. Further, since at least a portion of the first external connection terminal overlaps at least a portion of the passive component, the external connection terminals 151 can be disposed in the region including the passive component. This configuration thus helps to avoid the decrease in the number of external connection terminals 151 that can occur assuming the passive component is disposed at the major surface 90*b*. As a result, the radio-frequency module 1A can be joined to the mother substrate 1000 using many external connection terminals 151. As such, the double-sided mounting module can be more firmly fixed to the mother substrate 1000.

In an example, in the radio-frequency module 1A according to the present practical example, the plurality of electronic components may further include, as an active component including an active element, the integrated circuit including the power amplifier 11, the integrated circuit 20 including the low-noise amplifiers 21 to 23, or the integrated circuit 80 including the control circuit 81. The external connection terminals 151 may include the power supply terminal 131, 133 or 134, and a ground terminal. The passive component may include the capacitor 71, 73, or 74. The power supply terminal 131, 133, or 134 may be coupled to one end of the capacitor 71, 73, or 74 and to the active element. The ground terminal may be coupled to the other end of the capacitor 71, 73, or 74. The first external connection terminal may be the power supply terminal 131, 133, or 134, or the ground terminal.

Since the capacitor 71, 73, or 74 (bypass capacitor) coupled to the power supply terminal 131, 133, or 134 and the ground terminal is disposed at the major surface 90*b*, electrical connection between the power supply terminal 131, 133, or 134 and the capacitor 71, 73, or 74 and electrical connection between the ground terminal and the capacitor 71, 73, or 74 can be established with the wires at the major surface 90*b* of the module substrate 90. This configuration thus reduces the wire length.

In an example, in the radio-frequency module 1A according to the present practical example, the external connection terminals 151 may further include a particular external connection terminal 151 that does not overlap the passive component in plan view of the module substrate 90. The external connection terminal 713, 733, or 743 may be the ground terminal. The particular external connection terminal 151 may be the power supply terminal 131, 133, or 134 and may be coupled to one end of the capacitor 71, 73, or 74 and the control circuit 81 via at least one of the post electrodes 150.

Since the external connection terminal 151 that does not overlap the capacitor 71, 73, or 74 is used as the power supply terminal 131, 133, or 134, the power supply terminal 131, 133, or 134 can be more firmly joined to the radio-frequency module 1A than the ground terminal that overlaps the capacitor 71, 73, or 74. This configuration thus reduces the likelihood of the failure of the radio-frequency module 1A assuming the power supply terminal 131, 133, or 134 becomes detached.

In an example, the radio-frequency module 1A according to the present practical example may further include the control circuit 81 configured to control the power amplifiers 11 and 12. The active component may be the integrated circuit 80 including the control circuit 81.

With this configuration, the bypass capacitor coupled to the power supply line for the control circuit 81 can be disposed at the major surface 90*b*.

In an example, the radio-frequency module 1A according to the present practical example may further include the low-noise amplifiers 21 to 23. The active component may be the integrated circuit 20 including the low-noise amplifiers 21 to 23.

With this configuration, the bypass capacitor coupled to the power supply line for the low-noise amplifiers 21 to 23 can be disposed at the major surface 90*b*.

In an example, the radio-frequency module 1A according to the present practical example may further include the power amplifier 11. The active component may be the integrated circuit including the power amplifier 11.

With this configuration, the bypass capacitor coupled to the power supply line for the power amplifier 11 can be disposed at the major surface 90*b*.

In an example, in the radio-frequency module 1A according to the present practical example, the passive component may be a semiconductor component.

With this configuration, the thickness of the passive component disposed at the major surface 90*b* can be reduced, and the height of the radio-frequency module 1A can be accordingly reduced.

In an example, in the radio-frequency module 1A according to the present practical example, an IPD may be formed using a semiconductor substrate.

This configuration reduces the size of the radio-frequency module 1A in addition to the height of the radio-frequency module 1A.

In an example, in the radio-frequency module 1A according to the present practical example, the capacitor 74 may have the major surface 74*a*, which faces the major surface 90*b*, and the major surface 74*b*, which is opposite to the major surface 74*a*. At least a portion of the major surface 74*b* may be exposed at the surface of the resin member 92.

With this configuration, the major surface 74*b* of the capacitor 74 can be ground, and the height of the radio-frequency module 1A can be further reduced.

In an example, in the radio-frequency module 1A according to the present practical example, the external connection terminal 743 may be in physical contact with the capacitor 74.

With this configuration, the external connection terminal 743 can be directly joined to the capacitor 74.

The communication device 6 according to the present practical example includes the RFIC 3 configured to process a radio-frequency signal and the radio-frequency module 1A configured to transfer the radio-frequency signal between the RFIC 3 and the antenna 2.

This configuration enables the communication device 6 to achieve the effects of the radio-frequency module 1A.

[2.2 Second Practical Example]

Next, as a second practical example of the radio-frequency circuit 1 according to the embodiment described above, a radio-frequency module 1B including the radio-frequency circuit 1 will be described. This practical example primarily differs from the first practical example in that a resin film 94 is disposed under the resin member 92. In the following, the radio-frequency module 1B according to the present practical example will be described with reference to FIGS. 7 and 8, focusing primarily on features that differ from the first practical example.

[2.2.1 Component Layout of Radio-Frequency Module 1B]

Figure 7:
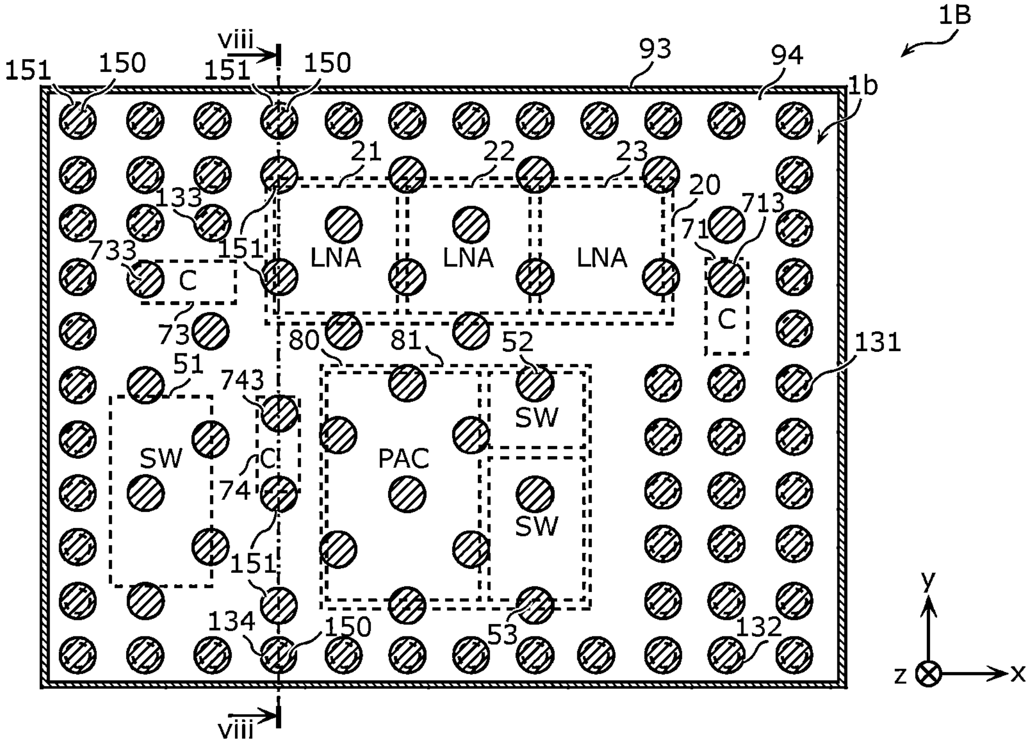
FIG. 7 is a plan view of a radio-frequency module according to a second practical example.
Figure 8:
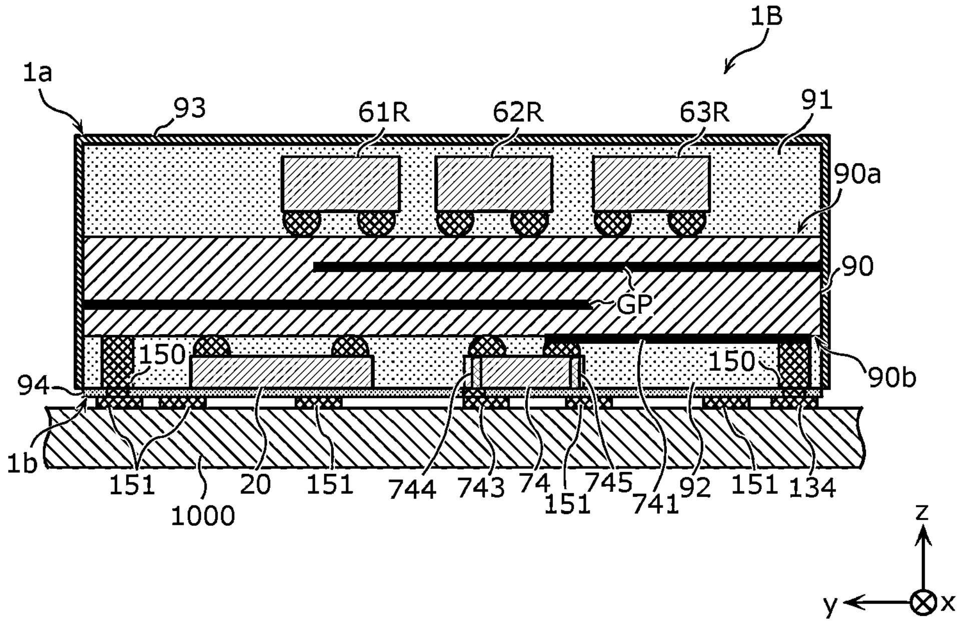
FIG. 8 is a sectional view of the radio-frequency module according to the second practical example.

FIG. 7 is a plan view of the radio-frequency module 1B according to the present practical example assuming a major surface 1*b* of the radio-frequency module 1B is viewed through the radio-frequency module 1B from the positive side of the z-axis. FIG. 8 is a sectional view of the radio-frequency module 1B according to the present practical example. The section plane of the radio-frequency module 1B in FIG. 8 is taken along line viii-viii in FIG. 7. In FIG. 7, to simplify understanding of the positional relationships of the components, each component is labeled with letters representing the circuit that is included in the component. However, these letters are not marked on the actual components. Also, in FIG. 8, terminals at a mother substrate 1000 are not illustrated.

In the present practical example, the radio-frequency module 1B additionally includes the resin film 94 as well as the components included in the radio-frequency module 1A according to the first practical example. The resin film 94 is an example of a second resin member. The resin film 94 is disposed over the resin member 92. More specifically, the resin film 94 extends over the resin member 92, covering the electronic components disposed at the major surface 90*b*. The resin member 92 is disposed between the capacitor 74 and the external connection terminal 743 in sectional view of the module substrate 90. One of the two major surfaces of the resin film 94 is in physical contact with the capacitor 74. The other of the two major surfaces of the resin film 94 is in physical contact with the external connection terminal 743. The two major surfaces of the resin film 94 are not necessarily in contact with the capacitor 74 and the external connection terminal 743.

The resin film 94 has multiple through-holes. Each post electrode 150 is electrically coupled to a corresponding external connection terminal 151 through a corresponding through-hole. At least a portion of each post electrode 150 overlaps at least a portion of a corresponding through-hole in plan view of the module substrate 90. At least a portion of the external connection terminal 151 coupled to each post electrode 150 overlaps at least a portion of a corresponding through-hole in plan view of the module substrate 90. As a result, the post electrodes 150 and the external connection terminals 151 can be coupled over the shortest distance along the z-axis.

The resin film 94 is made of a material that is different from the resin member 92. Specifically, the resin film 94 is made of a material that is different from the resin member 92 with respect to permittivity. In this example, the permittivity of the resin film 94 is lower than the permittivity of the resin member 92. However, the resin film 94 is not limited to the above example. The permittivity of the resin film 94 may be the same as or higher than the permittivity of the resin member 92. The resin film 94 may be made of the same material as the resin member 92.

Permittivity is represented by a coefficient that indicates the relationship between electric charge and the force exerted by the electric charge in a material. In this example, permittivity is measured using a cavity resonator method. The permittivity at a frequency that is representative of the bands A, B, and C supported by the radio-frequency module 1B is used.

The external connection terminals 151 are disposed at the resin film 94. Some of the external connection terminals 151 overlap the integrated circuits 20 and 80 and the switch 51 in plan view of the module substrate 90. Some of the external connection terminals 151 are not electrically coupled to any electronic components in the radio-frequency module 1B. In the present practical example, the number of external connection terminals 151 is higher than that in the first practical example. The external connection terminals 151 overlapping the integrated circuits 20 and 80 and the switch 51 may be either electrically coupled or uncoupled to the integrated circuits 20 and 80 and the switch 51.

In plan view of the module substrate 90, the area of the external connection terminal 743 is larger than the area of a corresponding through-hole, and the center of the external connection terminal 743 coincides with the center of the through-hole. As a result, one portion (perimeter region) of the external connection terminal 743 is in physical contact with the resin film 94. The other portion (center region) of the external connection terminal 743 coincides with the through-hole in the resin film 94 in plan view of the module substrate 90 and is electrically coupled to the electrode 744 of the capacitor 74 via the through-hole. In plan view of the module substrate 90, the area of the external connection terminal 743 may be the same as or smaller than the area of the through-hole; and the center of the external connection terminal 743 may deviate from the center of the through-hole.

[2.2.2 Effects of Radio-Frequency Module 1B]

As described above, the radio-frequency module 1B according to the present modification further includes the resin film 94 disposed over the resin member 92. The resin film 94 is disposed between the capacitor 74 and the external connection terminal 743 in sectional view of the module substrate 90.

With this configuration, the external connection terminal 743 is fixed with the resin film 94 interposed. As a result, the external connection terminal 743 can be more firmly fixed to the radio-frequency module 1B than assuming the external connection terminal 743 is in direct contact with the capacitor 74.

As described above, in the radio-frequency module 1B according to the present modification, the resin film 94 may extend over the resin member 92 to cover the electronic components disposed at the major surface 90*b*.

With this configuration, the resin film 94 extensively covers the major surface 1*b* side of the radio-frequency module 1B, thereby rendering the major surface 1*b* flatter.

As described above, in the radio-frequency module 1B according to the present modification, a plurality of through-holes may be formed in the resin film 94. At least a portion of each post electrode 150 may overlap at least a portion of a corresponding through-hole in the resin film 94 in plan view of the module substrate 90. Each post electrode 150 may be electrically coupled to a corresponding external connection terminal 151 through a corresponding through-hole.

With this configuration, the post electrodes 150 and the external connection terminals 151 are coupled via the through-holes in the resin film 94. As a result, the resin film 94 does not need to include any planar wiring patterns inside the resin film 94. This configuration renders the resin film 94 thinner, thereby contributing to the reduction in the height of the radio-frequency module 1B.

As described above, in the radio-frequency module 1B according to the present modification, the permittivity of the resin film 94 may be lower than the permittivity of the resin member 92.

This configuration enhances the shielding effect by the resin film 94 and inhibits external noise from the mother substrate 1000 from interfering with the electronic components included in the radio-frequency module 1B.

As described above, in the radio-frequency module 1B according to the present modification, a portion of the external connection terminal 743 may be in physical contact with the resin film 94.

Although the external connection terminal 743 is coupled to the capacitor 74 via a through-hole, the external connection terminal 743 can leave a portion in physical contact with the resin film 94. This configuration thus enables the external connection terminal 743 to be firmly fixed to the radio-frequency module 1B.

(Modifications)

The radio-frequency module and the communication device according to the present disclosure have been described above based on the embodiment and practical examples. However, the radio-frequency module and the communication device are not limited to the embodiment and practical examples. The present disclosure also embraces other practical examples implemented by any combination of the constituent elements of the practical examples, other modifications obtained by making various modifications that occur to those skilled in the art without departing from the scope of the embodiment and practical examples, and various hardware devices including the radio-frequency module.

For example, in the circuit configuration of the radio-frequency circuit and the communication device according to the embodiment described above, other circuit elements and/or interconnections may also be inserted in the paths connecting the circuit elements and the signal paths that are illustrated in the drawings. For example, a matching circuit may be inserted between the radio-frequency input terminal 111 and the power amplifier 11 and/or between the radio-frequency input terminal 112 and the power amplifier 12. For example, a matching circuit may be inserted at least at one of the following locations: between the low-noise amplifier 21 and the radio-frequency output terminal 121, between the low-noise amplifier 22 and the radio-frequency output terminal 122, and between the low-noise amplifier 23 and the radio-frequency output terminal 123.

In the embodiment, the bands A to C represent bands for FDD, but the bands A to C may be bands for time division duplex (TDD). In this case, the transmit filter and the receive filter may be formed as a single filter.

In the embodiment, the radio-frequency circuit 1 includes the three low-noise amplifiers 21 to 23, but the number of low-noise amplifiers is not limited to three. The number of low-noise amplifiers may be one or two. For example, assuming the number of low-noise amplifiers is one, the radio-frequency circuit 1 may include a switch that is coupled between the low-noise amplifier and the receive filters 61R to 63R. In this case, the switch may be included in the integrated circuit 20.

In the practical examples described above, the resin film 94 extends over the resin member 92 to cover the electronic components disposed at the major surface 90*b*. However, this is not to be interpreted as limiting. For example, the resin film 94 may cover merely a portion of the electronic components disposed at the major surface 90*b*. In this case, the resin film 94 does not necessarily need to be in the form of a film.

In the practical examples, the external connection terminals 733 and 743 are electrically coupled to the capacitors 73 and 74 in the radio-frequency modules 1A and 1B. However, this is not to be interpreted as limiting. The external connection terminal 733 is not necessarily electrically coupled to the capacitor 73 in the radio-frequency modules 1A and 1B, and the external connection terminal 743 is not necessarily electrically coupled to the capacitor 74 in the radio-frequency modules 1A and 1B. Further, the external connection terminal 733 and/or the external connection terminal 743 is not necessarily electrically coupled to any of the components in the radio-frequency modules 1A and 1B. Also in this case, the external connection terminal 733 and/or the external connection terminal 743 can be used for coupling with the mother substrate 1000. As such, the double-sided mounting module can be more firmly fixed to the mother substrate 1000.

In the practical examples, the capacitors 73 and 74 are used as the passive component that overlaps the first external connection terminal in plan view. However, this is not to be interpreted as limiting. For example, the matching circuit 40 may be used as the passive component. This means that the external connection terminals 151 may include the antenna connection terminal 100; the radio-frequency module 1A and/or the radio-frequency module 1B includes the duplexers 61 to 63, the switch 51 coupled between the antenna connection terminal 100 and the duplexers 61 to 63, and the matching circuit 40 coupled between the antenna connection terminal 100 and the switch 51; and the passive component may include the matching circuit 40. Also in this case, electrical connection between the matching circuit 40 and the antenna connection terminal 100 and electrical connection between the matching circuit 40 and the ground terminal can be established with the wires at the major surface 90*b*. This configuration thus reduces the wire length.

In the practical examples, the external connection terminal 733 and/or the external connection terminal 743, which are ground terminals, may be disposed between two external connection terminals 151 (for example, any two of the antenna connection terminal 100, the radio-frequency input terminals 111 and 112, and the radio-frequency output terminals 121 to 123) for transferring radio-frequency signals, in plan view of the module substrate 90. This configuration improves isolation between the two radio-frequency terminals.

INDUSTRIAL APPLICABILITY

The present disclosure can be used as a radio-frequency module provided at the front-end in a wide variety of communication devices such as mobile phones.

REFERENCE SIGNS LIST

1 radio-frequency circuit
1A, 1B radio-frequency module
1*a*, 1*b*, 74*a*, 74*b*, 90*a*, 90*b* major surface
2 antenna
3 RFIC
4 BBIC
5 power supply circuit
6 communication device
11, 12 power amplifier
20, 80 integrated circuit
21, 22, 23 low-noise amplifier
40, 41, 42, 43, 44, 45 matching circuit
46, 47, 48 inductor
51, 52, 53 switch
61, 62, 63 duplexer
61R, 62R, 63R receive filter
61T, 62T, 63T transmit filter
71, 72, 73, 74 capacitor
81 control circuit
90 module substrate
91, 92 resin member
93 shield electrode layer
94 resin film
100 antenna connection terminal
111, 112 radio-frequency input terminal
121, 122, 123 radio-frequency output terminal
131, 132, 133, 134 power supply terminal
141 control terminal
150 post electrode
151, 713, 733, 743 external connection terminal
511, 512, 513, 514, 521, 522, 531, 532, 533, 746, 747 terminal
711, 731, 732, 741, 742 wire
744, 745 electrode
1000 mother substrate
GP ground electrode layer

The invention claimed is:

1. A radio-frequency module having a first major surface and a second major surface that are opposite to each other, the radio-frequency module comprising:

a module substrate having a third major surface and a fourth major surface that are opposite each other, the third major surface being disposed alongside the first major surface, the fourth major surface being disposed alongside the second major surface;

a plurality of electronic components disposed at the third major surface and at the fourth major surface;

a plurality of external connection terminals disposed at the second major surface, the plurality of external connection terminals including a first external connection terminal;

a first resin member at least partially covering the fourth major surface and an electronic component disposed at the fourth major surface; and a plurality of electrodes disposed at the fourth major surface, the plurality of electrodes being coupled to the plurality of external connection terminals, wherein the plurality of electronic components include a passive component that is disposed at the fourth major surface and that includes at least one of a capacitor and an inductor, at least a portion of the first external connection terminal overlaps at least a portion of the passive component in plan view of the module substrate, the passive component is exposed from the surface of the first resin member, the passive component and the first external connection terminal are in physical contact, the passive component is a capacitor, and the capacitor includes an electrode in physical contact with the first external connection terminal.

2. The radio-frequency module according to claim 1, wherein the plurality of electronic components further include an active component including an active element, the plurality of external connection terminals include a power supply terminal and a ground terminal, the power supply terminal is coupled to one end of the capacitor and the active element, the ground terminal is coupled to another end of the capacitor, and the first external connection terminal is the power supply terminal or the ground terminal.

3. The radio-frequency module according to claim 2, wherein the plurality of external connection terminals further include a second external connection terminal that does not overlap the passive component in plan view of the module substrate, the first external connection terminal is the ground terminal, and the second external connection terminal is the power supply terminal, and the second external connection terminal is coupled to the one end of the capacitor and the active element via at least one of the plurality of electrodes.

4. The radio-frequency module according to claim 3, further comprising a control circuit configured to control a power amplifier, wherein the active component includes the control circuit.

5. The radio-frequency module according to claim 3, further comprising a low-noise amplifier, wherein the active component includes the low-noise amplifier.

6. The radio-frequency module according to claim 3, further comprising a power amplifier, wherein the active component includes the power amplifier.

7. The radio-frequency module according to claim 6, wherein the passive component is a semiconductor component.

8. The radio-frequency module according to claim 6, wherein the passive component is an integrated passive device (IPD) using a semiconductor substrate.

9. The radio-frequency module according to claim 8, wherein the passive component has a fifth major surface and a sixth major surface, the fifth major surface facing the fourth major surface, the sixth major surface being opposite to the fifth major surface, and at least a portion of the sixth major surface is exposed at a surface of the first resin member.

10. The radio-frequency module according to claim 9, further comprising a second resin member disposed over the first resin member, wherein the second resin member is disposed between the passive component and the first external connection terminal in sectional view of the module substrate.

11. The radio-frequency module according to claim 10, wherein the second resin member extends over the first resin member to cover the electronic component disposed at the fourth major surface.

12. The radio-frequency module according to claim 11, wherein a plurality of through-holes are formed in the second resin member, at least a portion of each of the plurality of electrodes overlaps at least a portion of a corresponding through-hole in the second resin member in plan view of the module substrate, and each of the plurality of electrodes is electrically coupled to a corresponding external connection terminal via the corresponding through-hole.

13. The radio-frequency module according to claim 12, wherein a permittivity of the second resin member is lower than a permittivity of the first resin member.

14. The radio-frequency module according to claim 13, wherein a portion of the first external connection terminal is in physical contact with the second resin member.

15. The radio-frequency module according to claim 3, wherein the plurality of external connection terminals include a first radio-frequency terminal, a second radio-frequency terminal, and a ground terminal, and the first external connection terminal is a ground terminal, and the first external connection terminal is disposed between the first radio-frequency terminal and the second radio-frequency terminal in plan view of the module substrate.

16. The radio-frequency module according to claim 1, wherein the plurality of external connection terminals include an antenna connection terminal, the radio-frequency module further comprising:

a plurality of filters;

a switch coupled between the antenna connection terminal and the plurality of filters; and a matching circuit coupled between the antenna connection terminal and the switch, wherein the passive component includes the matching circuit.

17. The radio-frequency module according to claim 1, wherein the passive component is a semiconductor component.

18. A communication device comprising:

a signal processing circuit configured to process a radio-frequency signal; and the radio-frequency module according to claim 1, the radio-frequency module being configured to transfer the radio-frequency signal between the signal processing circuit and an antenna.

19. A radio-frequency module having a first major surface and a second major surface that are opposite to each other, the radio-frequency module comprising:

a module substrate having a third major surface and a fourth major surface that are opposite each other, the third major surface being disposed alongside the first major surface, the fourth major surface being disposed alongside the second major surface;

a plurality of electronic components disposed at the third major surface and at the fourth major surface;

a plurality of external connection terminals disposed at the second major surface, the plurality of external connection terminals including a first external connection terminal;

a first resin member at least partially covering the fourth major surface and an electronic component disposed at the fourth major surface;

a plurality of electrodes disposed at the fourth major surface, the plurality of electrodes being coupled to the plurality of external connection terminals, wherein the plurality of electronic components include a passive component that is disposed at the fourth major surface and that includes at least one of a capacitor and an inductor, and at least a portion of the first external connection terminal overlaps at least a portion of the passive component in plan view of the module substrate; and a second resin member on the first resin member, the second resin member being between the passive component and the first external connection terminal in a cross- sectional view of the module substrate.

20. The radio-frequency module according to claim 19, wherein the first external connection terminal is not electrically coupled to the passive component in the radio-frequency module.

* * * * *